March 28, 1967 J. Y. ROBERTSON 3,311,815
PRECISION REGULATED POWER SUPPLY
Filed June 28, 1963
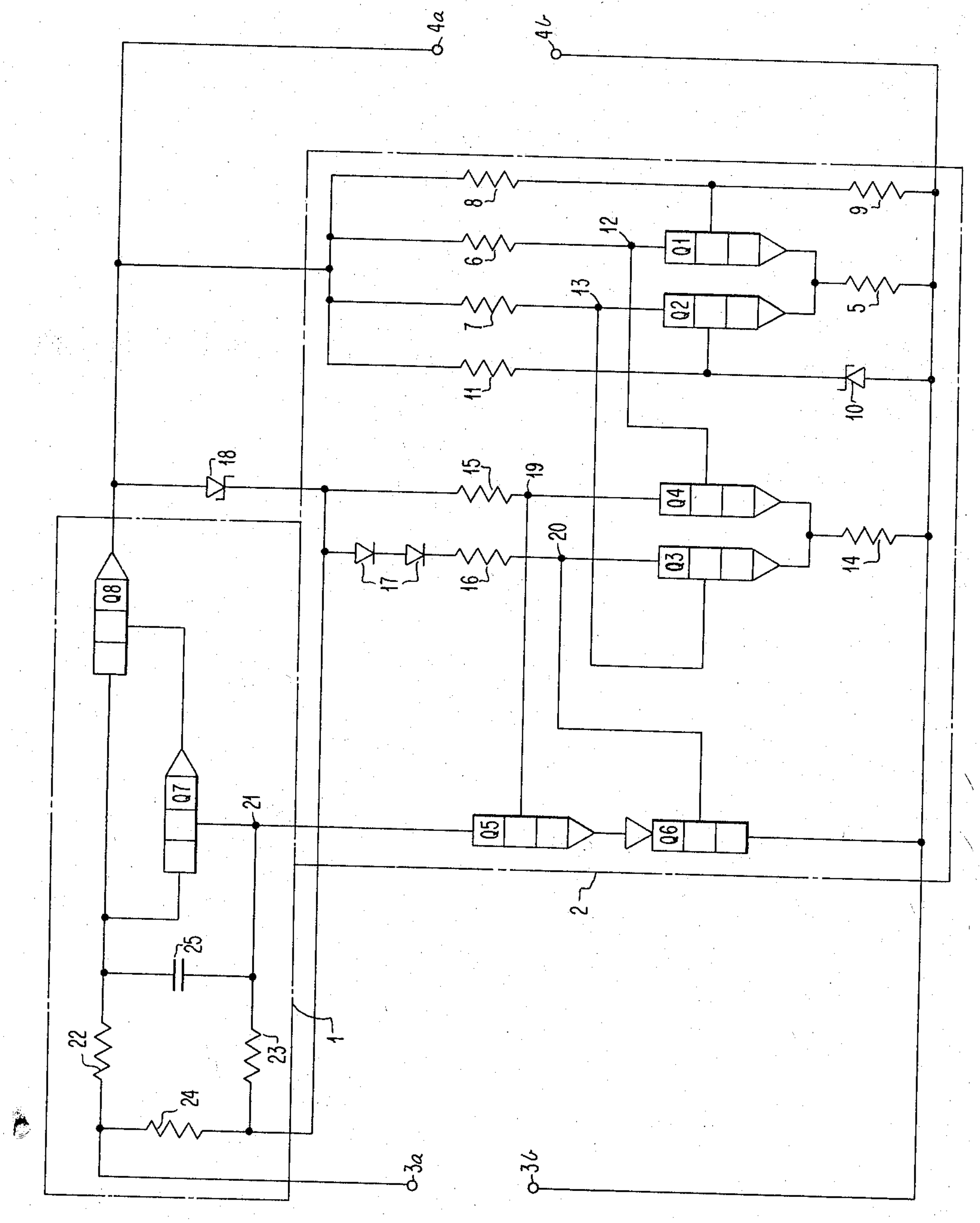
INVENTOR.
JOHN Y. ROBERTSON
BY Carl A. Lauman Jr.
ATTORNEY United States Patent Office 3,311,815
Patented Mar. 28, 1967

3,311,815

PRECISION REGULATED POWER SUPPLY

John Y. Robertson, Concord, Calif., assignor to International Business Machines Corporation, New York, N.Y., a corporation of New York Filed June 28, 1963, Ser. No. 291,541
7 Claims. (Cl. 323—22)

This invention relates generally to electrical amplifying systems, and particularly to differential amplifiers used in regulated power supplies.

Balanced difference amplifiers have many advantages over other configurations where stable operation is necessary. Through the application of known techniques it is possible to construct a differential amplifier which senses and amplifies the deviation of a signal voltage from a desired value. Such circuits are commonly used to compare a voltage, which is to be regulated, with a reference to derive a balanced error signal.

The error signal in its balanced or differential form has a number of desirable characteristics. Specifically, the drift due to variations in supply voltage, variations in gain, and common mode noise and thermal effects are substantially reduced or eliminated in the differential output signal. However, the signal in differential form is not always easy to use. In applications other than direct current or very low frequency, a transformer can be used as a balanced-to-unbalanced converter with only slight loss of the inherent advantages.

This form of coupling is not satisfactory for low frequency signals, and conventional practice has been to pick off one-half of the differential signal where low frequency response is required. While the signal so derived has lost the insensitivity to the previously mentioned variables and disturbances, the use of large amounts of negative feedback can provide acceptable results in many cases. While the problem can be solved with feedback it is not an entirely satisfactory approach since additional stages are required to compensate for the feedback which may make the amplifier frequency selective or unstable. Furthermore, as satisfactory as feedback may be, a better conversion from a balanced direct current signal to an unbalanced signal would retain all the advantages of the differential amplifier without the compensating circuits now required.

It is, therefore, an object of this invention to provide an amplifier having improved characteristics.

It is another object to provide an improved differential amplifier.

Another object is to provide improved means for deriving an unbalanced output from a balanced amplifier.

Still another object is to provide an improved voltage regulator.

A still further object is to provide an improved differential amplifier in the feedback circuit of a voltage regulator.

The foregoing and other objects, features and advantages of the invention will be apparent from the following more particular description of a preferred embodiment of the invention, as illustrated in the accompanying drawing.

The particular means for converting from the balanced differential output to the unbalanced or single ended output is a pair of complementary transistors having their emitters connected in common and their bases connected to be energized by the differential output signal. The collector loads for each transistor have equal resistive components but one load includes a voltage offset means such as a forward biased diode. The collectors of the complementary pair are connected to an appropriate utilization circuit. The diodes in one collector load provide a voltage difference at the collectors for the condition of equal voltages at the respective bases.

Current through the complementary pair is controlled by the potential difference between the two bases and common mode signals affecting both bases equally do not influence the current flowing in the collector circuits. The unbalanced current signal may be used in any convenient manner, for example to provide a voltage across an output resistor, or as in the preferred embodiment to control base current to a series dropping transistor connecting a voltage source to the power supply output terminals.

Since the current through the complementary pair of transistors is controlled by the voltage difference between the bases, equal simultaneous changes in the same direction at each base create no changes in the output current. In this manner the desirable characteristics of the differential amplifier are preserved. Consider the effect of a change in the supply voltage to the differential stage. This causes both output voltages to change in the same direction and in equal amounts. The differential output signal remains unchanged and, therefore, the voltage difference between the bases of the series connected pair stays at the previous level. This assures that there has been no change in the input signal.

A similar effect results where common mode noise produces equal shifts of the same polarity in the output voltage. Since the differential output signal is not affected, the current through the series connected complementary pair remains unchanged.

The embodiment shown in the drawing is a series voltage regulator utilizing the invention in the feedback loop 2 which provides a control signal to the variable impedance 1 in series between the input and output terminals 3 and 4, respectively.

The feedback loop 2 includes a differential amplifier stage having NPN transistors $Q_1$ and $Q_2$. The emitter electrodes of $Q_1$ and $Q_2$ are connected to a common resistor 5. Load resistors 6 and 7 have identical ohmic values and connect the collector electrodes of $Q_1$ and $Q_2$, respectively, to the supply voltage. The base electrode of $Q_1$ is connected to the junction of resistors 8 and 9. The other ends of resistors 8 and 9 are connected to output terminals *4a* and *4b*. It can thus be seen that the base of $Q_1$ is energized by a preset fraction of the output voltage at terminals *4a* and *4b*. The changes in base current at $Q_1$ are reflected by a corresponding change in the $Q_1$ collector potential.

The base electrode of $Q_2$ is energized from a fixed potential developed across zener diode 10 energized through resistor 11. $Q_1$ and $Q_2$ develop an output signal between terminals 12 and 13 which is proportional to the difference in voltages applied to the respective bases. Resistors 8 and 9 are selected to place the base of $Q_1$ at the same potential as that developed across zener diode 10 when the voltage between output terminals *4a* and *4b* is at the desired value. If the output voltage rises, the potential at the base of $Q_1$ also rises. The increased base current to $Q_1$ causes more current to flow through resistor 6, thus lowering the potential at the collector of $Q_1$. Since the base of $Q_2$ is held at a constant potential the increased emitter current of $Q_1$ causes a reduced current to flow through $Q_2$ and resistor 7. This has the effect of raising the output voltage at terminal 13. Where load resistors 6 and 7 are equal in value and the characteristics of $Q_1$ and $Q_2$ are the same, any change in the voltage at the base of $Q_1$ results in equal and opposite changes in voltage at output terminals 12 and 13.

A pair of active elements such as NPN transistors $Q_3$ and $Q_4$ make up a second differential amplifier stage. The base electrode of $Q_3$ is connected to output terminal 12 and the base electrode of $Q_4$ is connected to output terminal 13. Emitter electrodes of $Q_3$ and $Q_4$ are connected in common to resistor 14, the other end of which goes to terminal *4b*. A load resistor 15 connects the collector electrode of transistor $Q_4$ to a voltage source. The collector electrode of $Q_3$ is connected to a voltage source through resistor 16, equal in value to resistor 15, and two diodes 17 polarized for forward current flow. Both load circuits are energized from the regulated voltage through zener diode 18.

The diodes 17 have a voltage offset effect on the output signal from $Q_3$ and $Q_4$. Assuming that output terminals 12 and 13 are at the same potential, current through $Q_4$ and resistor 15 would equal current through $Q_3$ and resistor 16. Under this condition it is desirable to have a potential difference between output terminals 19 and 20. The addition of diodes 17 does not make a significant change in the load resistance for the collector of $Q_4$ and the resistive balance of collector loads is maintained. However, there is a voltage unbalance caused by the essentially constant voltage drop across diodes 17. These diodes cause the potential at terminal 19 to be slightly higher than the potential at terminal 20 when the base electrodes of $Q_3$ and $Q_4$ are at the same potential.

Another very significant function of the diodes is that they cause an offset potential which tracks with temperature. As the temperature increases, the potential across the diodes decreases. The base-emitter potentials of $Q_5$ and $Q_6$ decrease with increases in temperature so the diodes tend to compensate for this drift.

The significance of this offset is best understood from an investigation of the operation of the output stage, including transistors $Q_5$ and $Q_6$ which convert the balanced voltage signals between output terminals 19 and 20 to a single ended signal.

The base electrode of transistor $Q_5$ is connected to output terminal 19 and the base electrode of transistor $Q_6$ is connected to output terminal 20. When the currents through $Q_3$ and $Q_4$ are balanced, indicating equal potentials at output terminals 12 and 13, the potential at terminal 19 will be slightly more positive than the potential at terminal 20. This places the base electrode of $Q_5$ slightly more positive than the base electrode of $Q_6$. In this situation, both $Q_5$ and $Q_6$ are biased into conduction, $Q_5$ because the base is more positive than the emitter, and $Q_6$ because the base is more negative than the emitter.

The connection of the emitters of $Q_5$ and $Q_6$ in common permit a differential potential, connected to the bases, to control current flow between the collectors.

The collector of $Q_6$ is returned to ground and the collector of $Q_5$ is connected to a control terminal 21. Transistors $Q_7$ and $Q_8$ are connected in the well known compound connection. The collectors are fed from input terminal *3a* through resistor 22. The emitter of $Q_8$ is directly connected to output terminal *4a*. Resistor 22 is selected to limit the current through $Q_7$ and $Q_8$ in the event that output terminals *4a* and *4b* are shorted or the load is otherwise increased beyond normal limits. This resistor also reduces power dissipation in $Q_8$.

Base current to control the impedance presented by $Q_7$ and $Q_8$ is supplied through resistor 23 connected at one end to the junction between resistor 24 and zener diode 18. The potential at this junction provides a current source to terminal 21, connected to the base of transistor $Q_7$.

The current supplied through resistor 23 divides at terminal 21 with some passing to the base of $Q_7$ and the remainder passing through $Q_5$ and $Q_6$ to ground. Thus, an increase in current through $Q_5$ and $Q_6$ drains away base current from $Q_7$ to raise the impedance of $Q_7$ and $Q_8$ which operate to lower the output voltage across terminals *4a* and *4b*.

Capacitor 25 serves to slow the corrective regulating action and in turn stabilizes the feedback circuit.

The supply connected to input terminals *3a* and *3b* is not a critical item and may be any source of filtered direct current having sufficient voltage and current capacity to meet the needs at terminals *4a* and *4b* without going beyond the regulating limits of $Q_7$ and $Q_8$.

To review the foregoing description, assume a change in the load connected to output terminals *4a* and *4b*. In the case of a reduction in output current, the potential between terminals *4a* and *4b* will tend to rise. Due to the voltage divider of resistors 8 and 9 the potential at the base of transistor $Q_1$ will also rise. This gives a differential output signal between terminals 12 and 13 proportional to the difference between the reference voltage across zener diode 10 (base of $Q_2$) and the voltage at the junction of resistors 8 and 9 (base of $Q_1$). In the case of an increase of the voltage between terminals *4a* and *4b*, terminal 12 will become less positive due to increased conduction through $Q_1$ and the resulting higher drop across resistor 6. Terminal 13 on the other hand becomes more positive since $Q_2$ conducts less and the drop across resistor 7 is reduced.

The resulting differential signal at output terminals 12 and 13 is amplified by the stage including $Q_3$ and $Q_4$.

The more positive voltage at terminal 19 coupled to the base of $Q_5$ and the more negative voltage at terminal 20 coupled to the base of $Q_6$ serve to increase the current flow between the collectors. This increased current can only come from terminal 21.

The increased current through $Q_5$ and $Q_6$ reduces the amount of base current to $Q_7$ which in turn increases the impedance of $Q_7$ and $Q_8$ to restore the output voltage to the desired value.

In this manner the feedback loop 2 senses the output voltage, amplifies any error which may be present, and applies the corrective signal to the variable impedance element 1. While the example of corrective action specifically considered only the case where the output voltage was too high, the circuit functions equally well to compensate for the low voltage condition. Normally, such changes in output voltage result from load variations but the circuit also compensates to correct for changes caused by fluctuations of the voltage applied to terminals *3a* and *3b*.

While the invention has been particularly shown and described with reference to a preferred embodiment thereof, it will be understood by those skilled in the art that various changes in form and details may be made therein without departing from the spirit and scope of the invention.

What is claimed is:

1. In an amplifier having a differential stage with a pair of active elements, means for converting the difference in current through said elements to an unbalanced signal without loss of common mode rejection comprising:

first and second loads connected to said active elements, one said load consisting of a first resistance, the other of said loads consisting of a resistance equal in value to said first resistance and a series connected voltage offset means, a pair of transistors of opposite conductivity type each having a base, emitter and collector electrodes, circuit means respectively connecting said bases to the points intermediate said active elements and their respective loads to create a voltage between said bases responsive to the difference in individual voltages across said loads.

means connecting said emitter electrodes in common, and means connecting said collector electrodes to a utilization circuit.

2. In an amplifier having a differential stage with a pair of active elements, means for converting the difference in current through said elements to an unbalanced signal without loss of common mode rejection comprising:

first and second loads having equal resistive components, said second load further including a series connected voltage offset means for providing unequal voltage drop across said loads for equal currents flowing therethrough, means respectively connecting said loads to said active elements, a pair of transistors of opposite conductivity type each having a base, emitter and collector electrodes, circuit means respectively connecting said bases to points intermediate said active elements and said loads to place a voltage between said bases responsive to the difference in individual voltages across said loads, means connecting said emitter electrodes in common, and means connecting said collector electrodes to a utilization circuit.

3. A device according to claim 2 wherein said voltage offset means is a forward biased diode.

4. A device according to claim 2 wherein said voltage offset means is a plurality of series connected forward biased diodes.

5. A device according to claim 1 wherein said voltage offset means provides a voltage drop relatively independent of current through said load.

6. A device according to claim 1 wherein said utilization circuit comprises output load means connecting said collector electrodes to a voltage source whereby the current flowing in said output load means is responsive to the voltage difference between said first and second loads.

7. In a voltage regulating circuit, a source of electrical power, output terminals connected to said source, a variable impedance element connected in circuit with said source and said output terminals, a feedback loop connected to said output terminals and said variable impedance element to vary the impedance of said element in a manner to maintain a constant electrical condition to said output terminals, said feedback loop including an amplifier having a differential stage with a pair of active elements, means for converting the difference in current through said elements to an unbalanced signal without loss of common mode rejection comprising first and second loads connected to said active elements, one said load consisting of a first resistance, the other of said loads consisting of a resistance equal in value to said first resistance and a series connected voltage offset means, a pair of transistors of opposite conductivity type each having a base, emitter and collector electrodes, circuit means respectively connecting said bases to the points intermediate said active elements and their respective loads to create a voltage between said bases responsive to the difference in individual voltages across said loads, means connecting said emitter electrodes in common, and means connecting said collector electrodes to provide a variable current control signal to said variable impedance element.

References Cited by the Examiner

UNITED STATES PATENTS

| | | | |
|---|---|---|---|
| 3,076,135 | 1/1963 | Farnsworth | 323—22 |
| 3,196,343 | 7/1965 | Griffin | 323—22 |

References Cited by the Applicant

UNITED STATES PATENTS

| | | |
|---|---|---|
| 2,848,653 | 8/1958 | Hussey. |
| 3,005,147 | 10/1961 | Thomas. |

JOHN F. COUCH, *Primary Examiner.*

K. D. MOORE, *Assistant Examiner.*